United States Patent
Kim et al.

(10) Patent No.: US 9,685,912 B2
(45) Date of Patent: Jun. 20, 2017

(54) APPARATUS AND METHOD FOR HIGH-EFFICIENCY ENVELOPE AMPLIFIER USING ADJUSTMENT OF SWITCH CURRENT

(71) Applicant: POSTECH ACADEMY-INDUSTRY FOUNDATION, Pohang-si, Gyeongsangbuk-do (KR)

(72) Inventors: Bum Man Kim, Pohang-si (KR); Dong Su Kim, Pohang-si (KR); Joo Seung Kim, Daegu (KR)

(73) Assignee: POSTECH ACADEMY-INDUSTRY FOUNDATION, Pohang-si, Gyeonsangbuk-Do (KR)

( * ) Notice: Subject to any disclaimer, the term of this patent is extended or adjusted under 35 U.S.C. 154(b) by 0 days.

(21) Appl. No.: 14/895,672

(22) PCT Filed: May 26, 2014

(86) PCT No.: PCT/KR2014/004655
§ 371 (c)(1),
(2) Date: Dec. 3, 2015

(87) PCT Pub. No.: WO2014/196756
PCT Pub. Date: Dec. 11, 2014

(65) Prior Publication Data
US 2016/0134246 A1    May 12, 2016

(30) Foreign Application Priority Data

Jun. 4, 2013 (KR) .......................... 10-2013-0063842

(51) Int. Cl.
*H03F 3/217*    (2006.01)
*H03F 1/02*    (2006.01)
(Continued)

(52) U.S. Cl.
CPC ......... *H03F 1/0222* (2013.01); *H03F 1/0211* (2013.01); *H03F 3/16* (2013.01);
(Continued)

(58) Field of Classification Search
CPC ....................................................... H03F 3/217
(Continued)

(56) References Cited

U.S. PATENT DOCUMENTS

2002/0089316 A1* 7/2002 Liu ................... H02M 7/53871
                                                                    323/268
2004/0124913 A1    7/2004 Midya et al.
(Continued)

FOREIGN PATENT DOCUMENTS

| KR | 10-0881155 | 2/2009 |
|----|------------|--------|
| KR | 10-2011-0051526 | 5/2011 |
| WO | 2010/073942 | 7/2010 |

OTHER PUBLICATIONS

International Search Report for International Application No. PCT/KR2014/004655, dated Oct. 2, 2014.

*Primary Examiner* — Patricia T Nguyen
(74) *Attorney, Agent, or Firm* — Kile Park Reed & Houtteman PLLC

(57) ABSTRACT

The present invention provides an apparatus and method for an envelope amplifier using adjustment of a switch current, in order to maximize the efficiency of the envelope amplifier at the entire sections of envelope output power. The apparatus and method can extend the battery lifetime of portable wireless devices such as smart phones or mobile phones or application devices such as notebook computers, which use a battery as a power supply.

14 Claims, 6 Drawing Sheets

(51) Int. Cl.
*H03F 3/21* (2006.01)
*H03F 3/16* (2006.01)

(52) U.S. Cl.
CPC ........... *H03F 3/211* (2013.01); *H03F 3/2173* (2013.01); *H03F 2200/102* (2013.01); *H03F 2200/129* (2013.01); *H03F 2200/432* (2013.01)

(58) Field of Classification Search
USPC ................................. 330/251, 207 A, 124 R
See application file for complete search history.

(56) References Cited

U.S. PATENT DOCUMENTS

| | | | |
|---|---|---|---|
| 2005/0242875 A1 | 11/2005 | Gurvich et al. | |
| 2008/0224769 A1* | 9/2008 | Markowski | H03F 1/0227 330/10 |
| 2011/0109387 A1* | 5/2011 | Lee | H03F 1/0227 330/251 |
| 2012/0326783 A1* | 12/2012 | Mathe | H03F 1/0227 330/251 |
| 2014/0218109 A1* | 8/2014 | Wimpenny | H03F 3/217 330/251 |
| 2015/0137886 A1* | 5/2015 | Tanio | H03F 1/0222 330/251 |

* cited by examiner

APPARATUS AND METHOD FOR HIGH-EFFICIENCY ENVELOPE AMPLIFIER USING ADJUSTMENT OF SWITCH CURRENT

TECHNICAL FIELD

The present disclosure relates to an apparatus and method for a high-efficiency envelope amplifier using adjustment of a switch current, which is capable of adjusting a switch current to maximize the efficiency of an envelope amplifier in all sections of envelope output power, and more particularly, to an apparatus and method for a high-efficiency envelope amplifier using adjustment of a switch current, which is capable of controlling a supply voltage of a radio frequency (RF) power amplifier used in portable wireless devices such as smart phones or mobile phones or application devices such as notebook computers, which use a battery as a power supply.

BACKGROUND ART

A conventional envelope amplifier includes a linear amplifier, a switch amplifier, and a linear current detector. The linear amplifier is an independent voltage source which amplifies an envelope signal through a feedback network. The switch amplifier is a dependent current source which supplies the most amount of current required for an output current. The linear current detector detects the magnitude and direction of a linear current flowing from the linear amplifier to an output. The linear current detector changes the state (ON or OFF) of the switch amplifier to adjust a switch current.

The output current of the envelope amplifier includes a current flowing through the linear amplifier and a current flowing through the switch amplifier. The ratio of the linear current of the linear amplifier to the switch current of the switch amplifier serves as an important factor which determines the entire efficiency of the envelope amplifier.

When the switch current is smaller than the output current, a difference therebetween is added to the switch current by the linear current and then flows as the output current (source current). On the other hand, when the switch current is larger than the output current, a difference therebetween is subtracted from the switch current by the linear current and appears as the output current (sink current). The output current of the envelope amplifier corresponds to the sum of the switch current and the linear current. Thus, according to the efficiencies of the linear amplifier and the switch amplifier and the ratio of the switch current to the linear current, the entire efficiency of the envelope amplifier may be determined.

The conventional envelope amplifier uses a battery voltage as a supply voltage for the linear amplifier and the switch amplifier. However, since the battery voltage is changed according to the state of charge of the battery, the operations of the linear amplifier and the switch amplifier may be changed. In order to solve such a problem, the supply voltage of the linear amplifier may not be directly connected to the battery voltage, but a DC-DC converter may be used to provide a clamped supply voltage. The supply voltage of the switch amplifier may also be clamped through the DC-DC converter. However, the switch amplifier serves to supply a large amount of current to the entire output current. Thus, when the DC-DC converter is used, the entire efficiency may be degraded due to a power loss of the DC-DC converter.

In the envelope amplifier using the DC-DC converter, the DD-DC converter is used only in the linear amplifier. Thus, the supply voltages of the linear amplifier and the switch amplifier are asymmetrical with each other. Therefore, when the envelope amplifier is designed to be operated with the optimal efficiency at the maximum output power of the envelope amplifier, the envelope amplifier may not exhibit the optimal efficiency in case where the output power is lowered. This is because, since a customized switch current is designed to flow in case where the envelope amplifier has the maximum output power, the linear current and the switch current are set to the ratio at which the maximum efficiency can be exhibited. When a low input is applied, the amount of switch current is changed through the linear current amplifier.

However, due to the asymmetrical supply voltages of the linear amplifier and the switch amplifier, the amount of switch current is not automatically changed to the amount of switch current which maximizes the efficiency of the envelope amplifier, for low input power. Thus, as the output power of the envelope amplifier is changed from the maximum output power to low output power, the customized switch current does not flow. Furthermore, the efficiency may not be maximized in the entire output power region of the envelope amplifier.

The conventional envelope amplifier is designed to pass the switch current such that the envelope amplifier has the maximum efficiency at the maximum output power, without considering low output power. Thus, in the low output power region, the ratio of the linear current flowing through the linear amplifier and the switch current flowing through the switch amplifier may not correspond to the ratio at which the efficiency of the envelope amplifier is maximized.

DISCLOSURE

Technical Problem

Various embodiments are directed to an apparatus and method for an envelope amplifier which detects an envelope input signal or output signal to adjust a switch current, thereby having high efficiency in the entire output power region as well as at the maximum output power.

Technical Solution

In an embodiment, an apparatus for a high-efficiency envelope amplifier using adjustment of a switch current may include: a boost converter configured to receive power and output a clamped supplied voltage; a level adjuster configured to detect and smooth any one of an input signal and an output signal and output an adjusting current; a linear amplifier configured to receive the supply voltage, amplify the input signal to output a linear current, and feed back the linear current; a linear current detector configured to add/subtract the adjusting current to/from the linear current and output first and second detection signals; and a switch amplifier configured to receive the power and adjust a switch current through the first and second detection signals. At a first node, the linear current and the switch current may be combined to output an output current.

In another embodiment, a method for a high-efficiency envelope amplifier using adjustment of a switch current may include: receiving power and outputting a clamped supply voltage; outputting a linear current obtained by amplifying an input signal using the supply voltage; detecting any one of the input signal and an output signal and smoothing the detected signal to a level voltage; converting the level voltage into a current and outputting the current as an adjusting current; adding/subtracting the adjusting current to/from the linear current and output a detection signal; adjusting the switch current using the detection signal; combining the linear current and the switch current and outputting an output current; and feeding back the linear current and adjusting the linear current.

Advantageous Effects

According to the embodiments of the present invention, the apparatus and method for a high-efficiency envelope amplifier using adjustment of a switch current may add the signal detector for detecting the level of an input or output signal of an envelope and the switch current adjuster for passing a customized switch current according to the detected level, in order to automatically adjust the switch current. Thus, the envelope amplifier may have the maximized efficiency.

Thus, an envelope tracking power amplifier having high efficiency in the entire output power region can extend the battery lifetime of portable wireless devices such as smart phones or mobile phones or application devices such as notebook computers, which use a battery as a power supply.

MODE FOR INVENTION

Hereafter, exemplary embodiments of the present invention will be described in detail with reference to the accompanying drawings.

The embodiments of the present invention provide an envelope amplifier 100 which detects an envelope signal (input signal) or output signal and adjusts a switch current to maximize the efficiency of the envelope amplifier 100 in the entire output power region.

Figure 1:
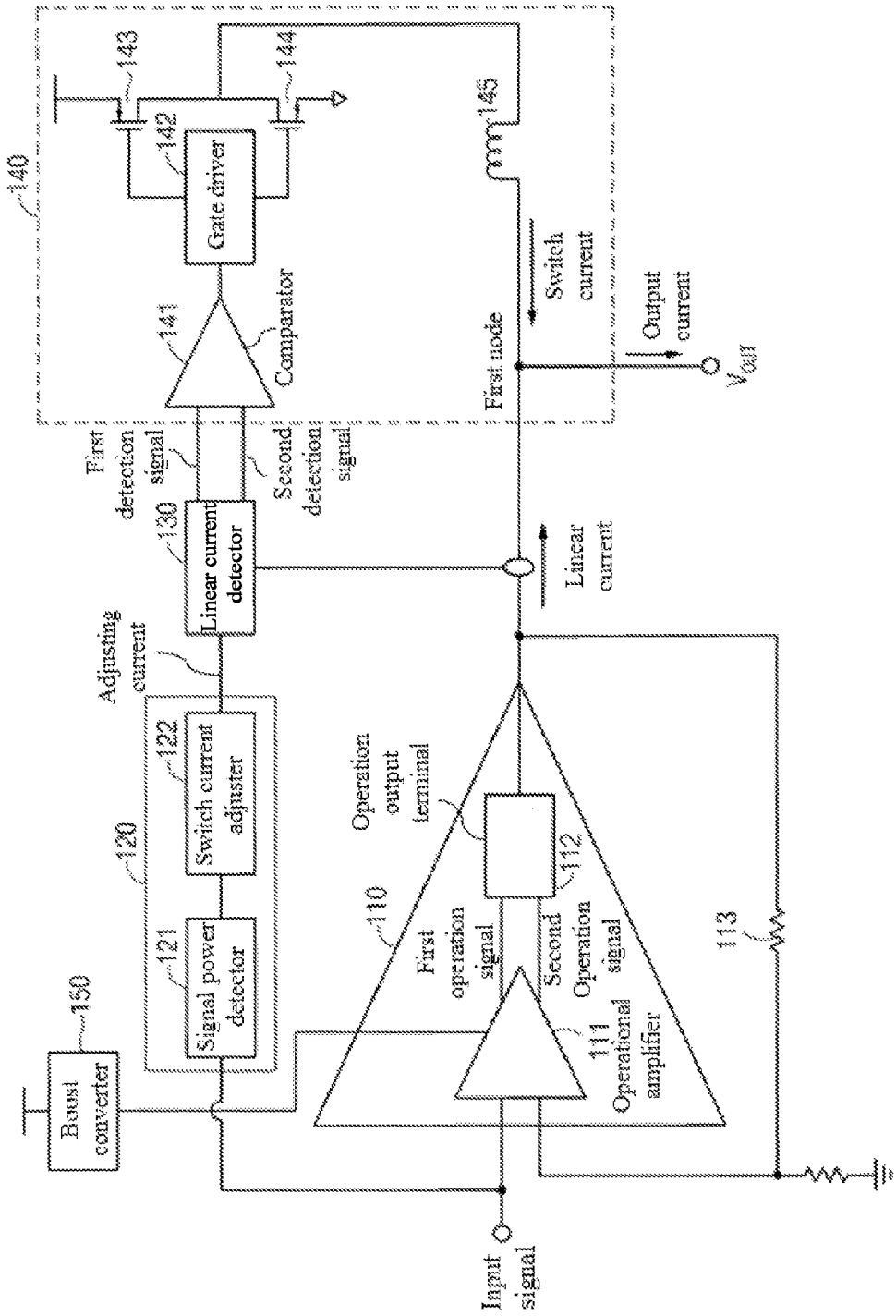
FIG. 1 is a diagram illustrating an apparatus for a high-efficiency envelope amplifier using adjustment of a switch current in accordance with an embodiment of the present invention.

FIG. 1 is a diagram illustrating an envelope amplifier 100 using a switch current adjuster 122 in accordance with an embodiment of the present invention.

Referring to FIG. 1, the envelope amplifier 100 includes a linear amplifier 110, a linear current detector 130, a switch amplifier 140, and a boost converter 150. Furthermore, the envelope amplifier 100 additionally includes a level adjuster 120.

The configuration of FIG. 1 is designed to detect an envelope signal of the envelope amplifier 100. Furthermore, the configuration of FIG. 1 is designed to detect an output signal. Furthermore, the configuration of FIG. 1 may be designed to receive the level of a radio frequency signal or envelope signal from outside.

The level adjuster 120 includes a signal power detector 121 and a switch current adjuster 122. The signal power detector 121 detects the power at which the envelope amplifier is operated, using any one of an envelope signal (input signal) and an output signal. The signal power detector 121 may include a low-pass filter.

The signal power detector 121 smoothes the detected power and outputs a level voltage. As the power is changed, the smoothed voltage is also changed. The power is input power applied to the envelope amplifier. According to data transmission power used in the envelope amplifier, the input power applied to the envelope amplifier is changed. When the power is reduced, the smoothed voltage obtained by detecting the power is also reduced. The smoothed voltage obtained by detecting the power is referred to as a level voltage.

The switch current adjuster 122 receives the level voltage and outputs an adjusting current.

The linear current detector 130 detects the magnitude and direction of a linear current flowing from the linear amplifier 110 to an output. The linear current detector 130 senses the linear current and passes the same amount of current. Furthermore, the linear current detector 130 add/subtracts the adjusting current to output first and second detection signals.

When detecting that a source current flows in the sensed linear current, the linear current detector 130 outputs the first and second sensing signals such that the first sensing signal becomes smaller than the second sensing signal. When detecting that a sink current flows in the sensed linear current, the linear current detector 130 outputs the first and second sensing signals such that the first sensing signal becomes larger than the second sensing signal.

The first and second detection signals outputted from the linear current detector 130 are inputted to the switch amplifier 140.

The values of the first and second detection signals outputted from the linear current detector 130 are determined according to two conditions. The first condition is the source current or sink current flowing in the linear current, and the second condition is the adjusting current of the level adjuster 120.

As the linear current detector 130 is controlled by the linear current and the adjusting current, the switch amplifier 140 may be efficiently operated.

Figure 2:
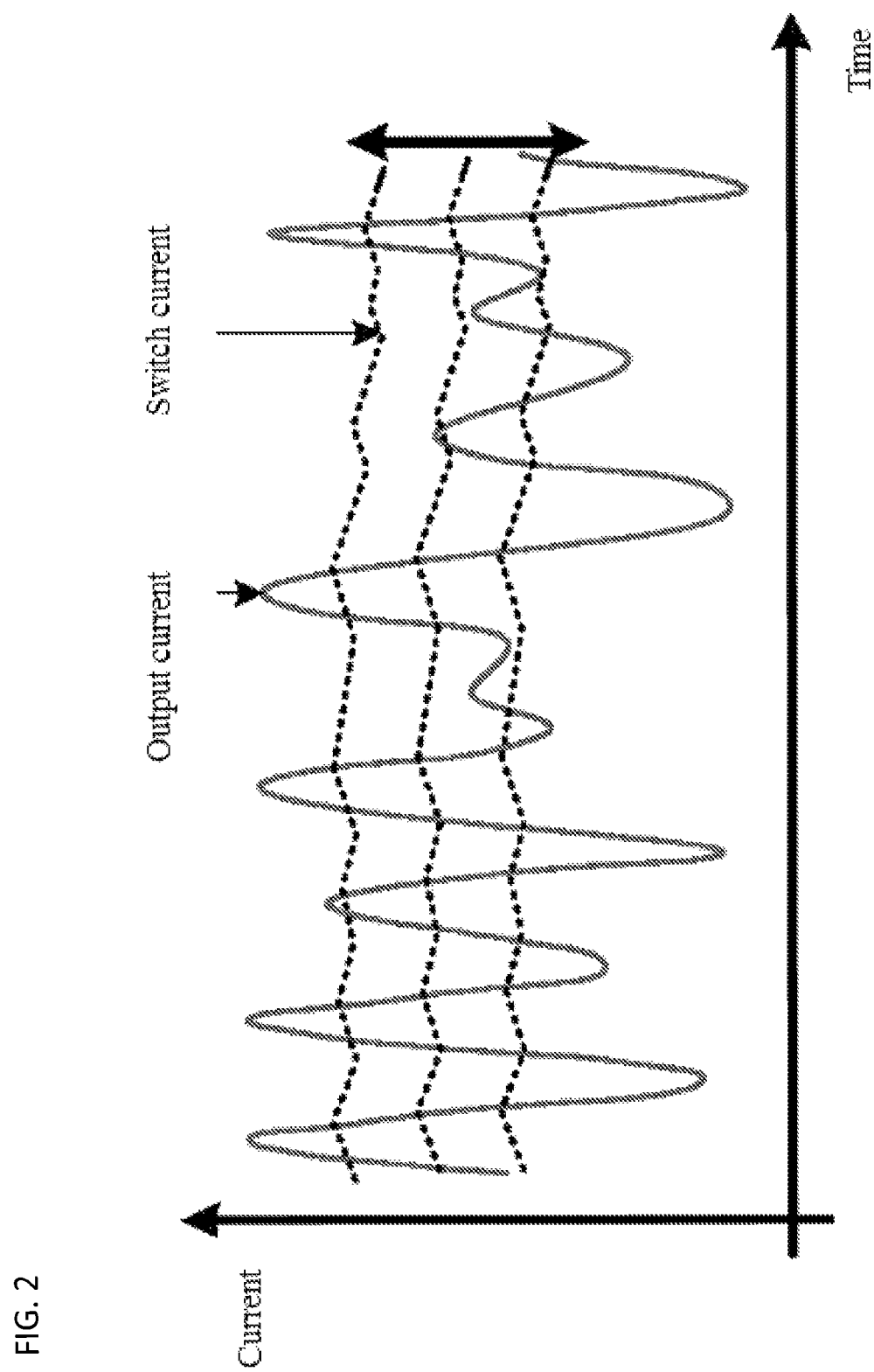
FIG. 2 is a graph illustrating the level changes of a switch current according to an output of a level adjuster included in the apparatus for a high-efficiency envelope amplifier using adjustment of a switch current in accordance with the embodiment of the present invention.

FIG. 2 is a graph illustrating the level changes of the switch current according to the output of the level adjuster 120 included in the envelope amplifier 100 using the switch current adjuster 122 in accordance with an embodiment of the present invention.

As illustrated in FIG. 2, a detected envelope input signal or output signal may be used to adjust the magnitude of the switch current according to a power level.

Thus, according to the power level, a customized switch current capable of maximizing the efficiency of the envelope amplifier 100 can be passed to the output.

The linear current detector 130 detecting the linear current receives the adjusting signal outputted from the level adjuster 120 and changes the detected signal. Then, the linear current detector 130 applies the first and second detection signals to a hysteresis comparator, using the changed signal.

The boost converter 150 receives power and provides a clamped supply voltage. The boost converter 150 uses a DC-DC converter.

The boost converter 150 provides the clamped supply voltage to the linear amplifier 110. The switch amplifier 140 receives a voltage from a power supply. That is, the linear amplifier 110 and the switch amplifier 140 do not used the same voltage. Due to such a structure, the voltages supplied to the linear amplifier 110 and the switch amplifier 140 may be different from each other and asymmetrical with each other.

The linear amplifier 110 receives a supply voltage, and amplifies an envelope signal. In addition, the linear amplifier 110 feeds back a linear current which is an output of the linear amplifier 110, determines the magnitude and polarity of the linear current, and outputs the linear current.

When the switch current is smaller than the current of the output signal based on the linear current outputted from the linear amplifier 110, a source current is passed to add an insufficient amount of current. Furthermore, when the switch current is larger than the current of the output signal, a sink current is passed to subtract an excessive amount of current.

The switch amplifier 140 supplies the most amount of current required for the output current. The switch amplifier 140 is operated at low speed, but has high efficiency. The switch amplifier 140 receives power, the receives the first and second detection signals to adjust the switch current, and combines the linear current and the switch current to output an output signal.

The switch amplifier 140 includes a hysteresis comparator 141, a gate driver 142, power transistors 143 and 144, and an inductor 145.

The hysteresis comparator 141 receives the first and second detection signals, compares the two signals, and outputs a comparison signal. The comparison signal of the hysteresis comparator 141 controls the switch amplifier 140. When the first detection signal is smaller than the second detection signal, the hysteresis comparator 141 adjusts the amount of switch current such that the amount of switch current increases. On the other hand, when the first detection signal is larger than the second detection signal, the hysteresis comparator 141 adjusts the amount of switch current such that the amount of switch current decreases. The first and second signals applied to the hysteresis comparator 141 may be continuously changed.

The hysteresis comparator 141 may receive the first and second detection signals, compare the two signals, and output a pulse-shaped comparison signal.

According to the comparison signal, the gate driver 142 outputs a pulse-shaped control signal. The power transistors 143 and 144 are turned on/off according to the control signal outputted from the gate driver 142 and pass the switch current.

Through the on/off of the gate driver 142, the level of the switch current $I_{switch}$ flowing through the power transistors 143 and 144 may be adjusted. The efficiency of the envelope amplifier 100 is determined according to the efficiencies of the linear amplifier 110 and the switch amplifier 140 forming the envelope amplifier 100. The efficiencies of the linear amplifier 110, the switch amplifier 140, and the envelope amplifier 100 may be expressed as the following equations.

[Equation 1]
$$\eta \text{ linear amplifier} = \frac{V_{out} \times I_{source}}{P_{dc.linear}} = \frac{V_{out} \times I_{source}}{V_{dc.linear} \times I_{dc.linear}}$$

[Equation 2]
$$\eta \text{ switch amplifier} = \frac{V_{out} \times (I_{switch} - I_{sink})}{P_{dc.switch}} = \frac{V_{out} \times (I_{switch} - I_{sink})}{V_{dc.switch} \times I_{dc.switch}}$$

[Equation 3]
$$\eta \text{ envelope amplifier} = \frac{V_{out} \times I_{out}}{P_{dc.overall}}$$
$$= \frac{V_{out} \times I_{out}}{(P_{dc.linear} + P_{dc.switch})}$$
$$= \frac{V_{out} \times (I_{switch} + I_{source} - I_{sink})}{(P_{dc.linear} + P_{dc.switch})}$$
$$= \frac{V_{out} \times I_{source}}{(P_{dc.linear} + P_{dc.switch})} + \frac{V_{out} \times (I_{switch} - I_{sink})}{(P_{dc.linear} + P_{dc.switch})}$$
$$= \frac{P_{dc.linear}}{(P_{dc.linear} + P_{dc.switch})} \times \frac{V_{out} \times I_{source}}{P_{dc.linear}} +$$
$$\frac{P_{dc.switch}}{(P_{dc.linear} + P_{dc.switch})} \times \frac{V_{out} \times (I_{switch} - I_{sink})}{P_{dc.switch}}$$
$$= (1-\alpha) \times \eta \text{ linear amplifier} +$$
$$\alpha \times \eta \text{ switch amplifier}$$

In Equations 1 to 3, $V_{out}$ represents an output voltage of the envelope amplifier 100, $I_{out}$ represents an output current, $I_{source}$ represents a source current, $I_{sink}$ represents a sink current, $I_{switch}$ represents a switch current, $V_{dc.linear}$ represents a DC voltage of the linear amplifier 110, $V_{dc.switch}$ represents a DC voltage of the switch amplifier 140, $P_{dc.linear}$ represents DC power consumption of the linear amplifier 110, $P_{dc.switch}$ represents DC power consumption of the switch amplifier 140, and $P_{dc.overall}$ represents DC power consumption of the envelope amplifier 100. Furthermore, $I_{dc.linear}$ represents a current supplied to the linear amplifier, and $I_{dc.switch}$ represents a current supplied to the switch amplifier.

Furthermore, α represents the ratio of the DC power consumption of the entire envelope amplifier 100 to the DC power consumption of the switch amplifier 140.

As known from Equations 1 to 3, the entire efficiency of the envelope amplifier 100 has a relation to the efficiency of the linear amplifier 110 and the efficiency of the switch amplifier 140. The entire efficiency of the envelope amplifier 100 has a close relation to the ratio of the current flowing from the linear amplifier 110 to the current flowing from the switch amplifier 140.

Thus, the high-efficiency linear amplifier 110 and the switch amplifier 140 need to be designed according to the input levels of the respective envelope signals. However, the currents flowing from the linear amplifier 110 and the switch amplifier 140 need to be optimized for the respective input levels.

The adjusted switch current is passed through the inductor 145, combined with the linear current outputted from the linear amplifier 110, and outputted as an output signal.

The linear amplifier 110 includes an operational amplifier 111, an operation output terminal 112, and a feedback resistor 113. The operational amplifier 111 receives an input signal through a positive input, and generates first and second operation signals reverse to each other. The operation output terminal 112 receives the first and second operation signals and outputs a linear current. The feedback resistor 113 feeds back the linear current to a negative input of the operational amplifier 111.

The operation output terminal 112 outputs the source current according to control of the first operation signal, and outputs the sink current according to control of the second operation signal. Thus, the linear current is any one of the source current and the sink current.

The envelope amplifier 100 to which the level adjuster 120 is added may automatically pass the customized switch current even though any envelope signal is inputted. Thus, the efficiency of the envelope amplifier 100 can be maximized in the entire output power region.

Figure 3:
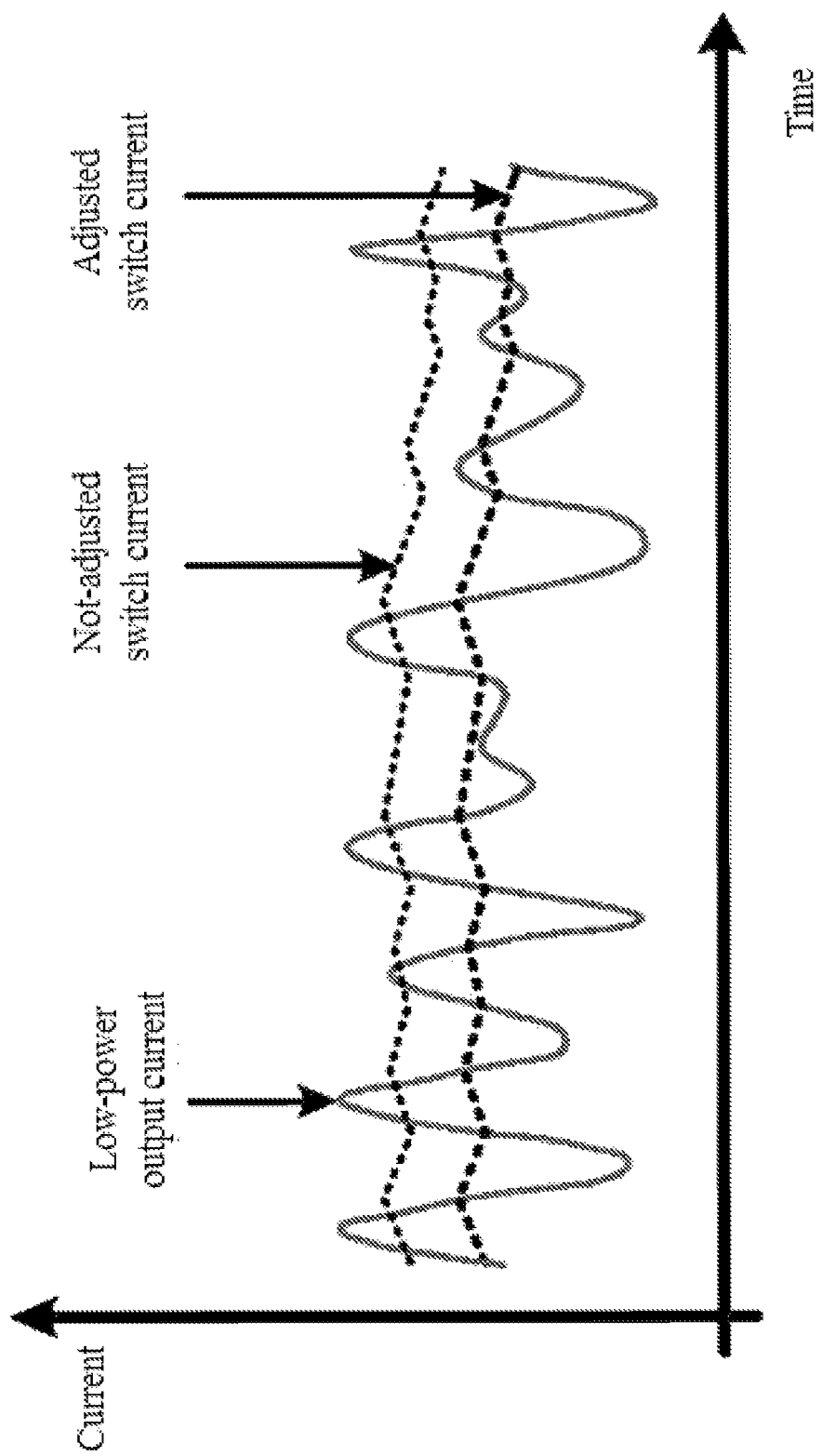
FIG. 3 is a graph illustrating an output current and a switch current of the envelope amplifier when an input signal of the apparatus for a high-efficiency envelope amplifier using adjustment of a switch current in accordance with the embodiment of the present invention has a low level.

FIG. 3 is a graph illustrating an output current and a switch current when an input signal of the envelope amplifier 100 using the switch current adjuster 122 in accordance with the embodiment of the present invention has a low level.

FIG. 3 illustrates the average switch current of the conventional envelope amplifier 100 and the average switch current of the envelope amplifier 100 in accordance with the embodiment of the present invention, which are optimized at the maximum power, when a low-power input is inputted to the envelope amplifiers 100.

Referring to FIG. 3, the conventional envelope amplifier 100 does not adjust the switch current according to the input level which decreases. However, the envelope amplifier 100 in accordance with the embodiment of the present invention may detect the input level, and adjust the switch current to the customized average switch current, thereby having the maximized efficiency for a low input level.

Since the envelope amplifier 100 in accordance with the embodiment of the present invention adjusts the level of the switch current with respect to the level of the envelope signal (input signal) or output signal, the envelope amplifier 100 needs to detect the level of the envelope signal (input signal) or output signal. The role is performed by the signal power detector 121. The signal power detector 121 may be connected to the output signal as well as the envelope signal (input signal) of the envelope amplifier 100.

Figure 4:
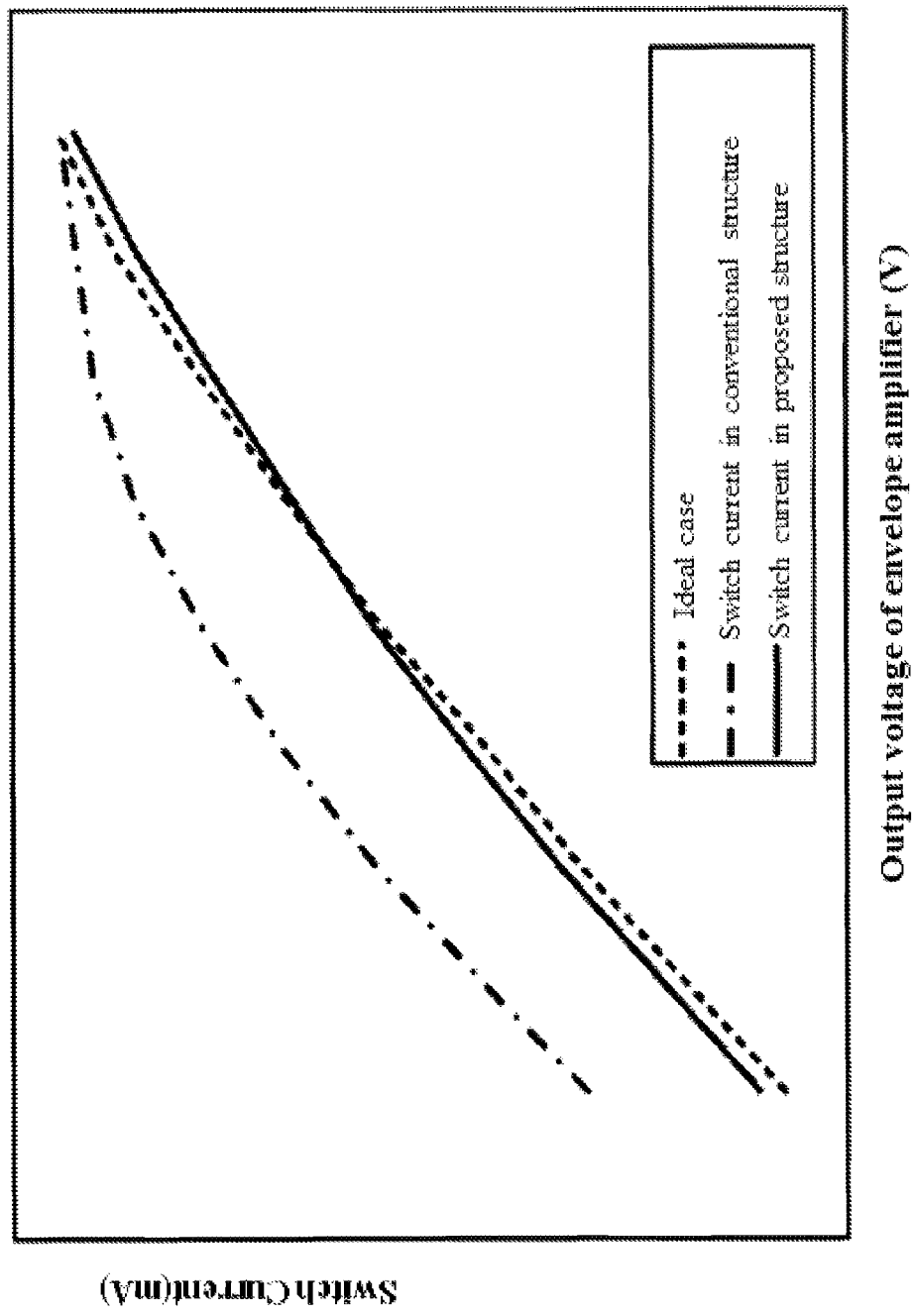
FIG. 4 is a graph illustrating a switch current based on an output voltage of the apparatus for a high-efficiency envelope amplifier using adjustment of a switch current in accordance with the embodiment of the present invention.

FIG. 4 is a graph illustrating the switch current based on the output voltage of the envelope amplifier 100 using the switch current adjuster 122 in accordance with the embodiment of the present invention.

As illustrated in FIG. 4, the switch current of the conventional envelope amplifier using the DC-DC converter is similar to the ideal case at the maximum input signal, but different from the ideal case as the level of the envelope signal decreases.

However, the envelope amplifier 100 in accordance with the embodiment of the present invention additionally includes the level adjuster 120 to pass a switch current similar to the ideal case at all output voltages of the envelope amplifier 100. As the switch current similar to the ideal case is passed, the customized switch current for each envelope signal may be passed, and the maximized efficiency can be obtained in the entire output power region of the envelope amplifier 100.

Figure 5:
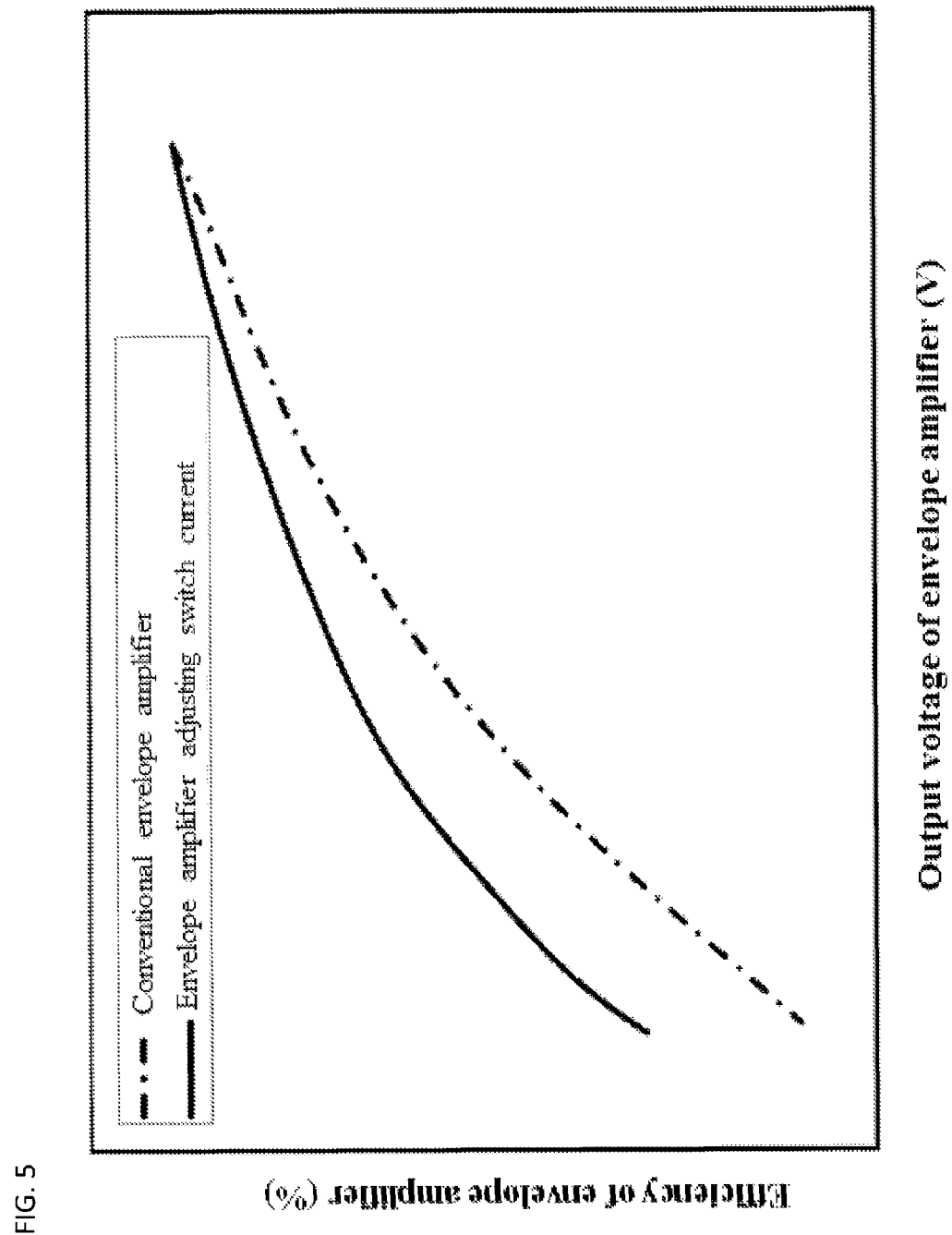
FIG. 5 is a graph illustrating efficiency with respect to an output voltage Vout when a modulated signal is applied to the apparatus for a high-efficiency envelope amplifier using adjustment of a switch current in accordance with the embodiment of the present invention.

FIG. 5 is a graph illustrating efficiency with respect to an output voltage Vout when a modulated signal is applied to the envelope amplifier 100 using the switch current adjuster 122 in accordance with the embodiment of the present invention.

The efficiency of the envelope amplifier 100 in accordance with the embodiment of the present invention, to which the level adjuster 120 is added, and the efficiency of the conventional envelope amplifier 100 are illustrated in FIG. 5. The envelope amplifier 100 in accordance with the embodiment of the present invention is operated at higher efficiency than the conventional envelope amplifier 100, as the output level or the input level decreases.

Figure 6:
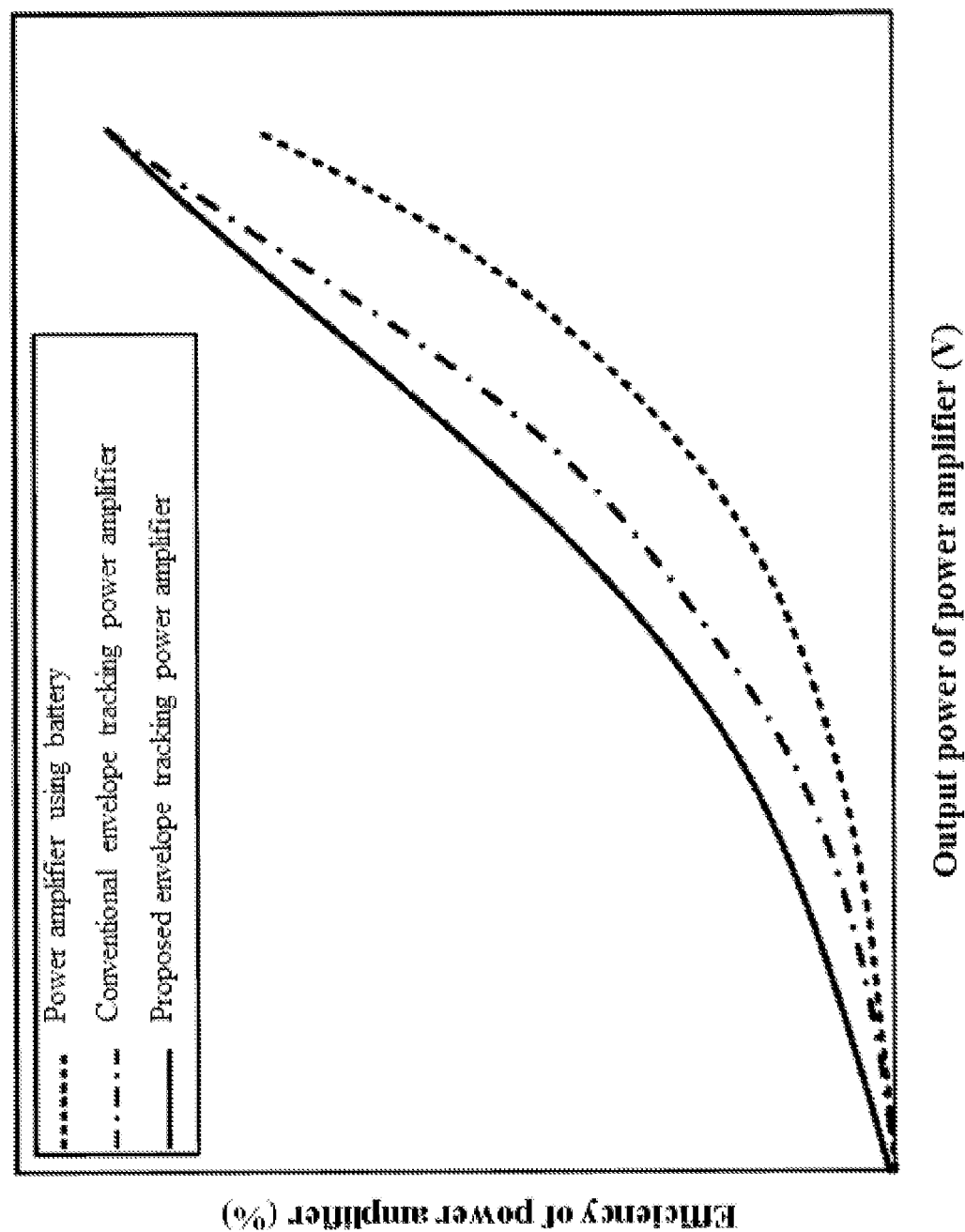
FIG. 6 is a graph illustrating efficiency with respect to output power of a power amplifier when a modulated signal is applied to the apparatus for a high-efficiency envelope amplifier using adjustment of a switch current in accordance with the embodiment of the present invention.

FIG. 6 is a graph illustrating efficiency with respect to output power of a power amplifier when a modulated signal is applied to the envelope amplifier 100 using the switch current adjuster 122 in accordance with the embodiment of the present invention.

FIG. 6 illustrates the efficiency of a power amplifier which is directly connected to a battery power, the efficiency of a conventional envelope tracking power amplifier which uses a DC-DC converter but does not adjust a switch current and the efficiency of an envelope tracking power amplifier using the envelope amplifier 100 in accordance with the embodiment of the present invention.

Referring to FIG. 6, the envelope tracking power amplifier using the envelope amplifier 100 in accordance with the embodiment of the present invention has higher efficiency than the conventional envelope tracking power amplifier. Furthermore, the envelope tracking power amplifier using the envelope amplifier 100 in accordance with the embodiment of the present invention, which improves the efficiency of the envelope amplifier 100 by adjusting the switch current, has higher efficiency in the entire output power region than the conventional envelope tracking power amplifier.

While various embodiments have been described above, it will be understood to those skilled in the art that the embodiments described are by way of example only. Accordingly, the disclosure described herein should not be limited based on the described embodiments.

The invention claimed is:

1. An apparatus for a high-efficiency envelope amplifier using adjustment of a switch current, comprising:
    a boost converter configured to receive power and output a clamped supplied voltage;
    a level adjuster configured to detect and smooth any one of an input signal and an output signal and output an adjusting current;
    a linear amplifier configured to receive the supply voltage, amplify the input signal to output a linear current, and feed back the linear current;
    a linear current detector configured to add/subtract the adjusting current to/from the linear current and output first and second detection signals; and
    a switch amplifier configured to receive the power and adjust a switch current through the first and second detection signals,
    wherein at a first node, the linear current and the switch current are combined to output an output current,
    wherein the switch amplifier comprises:
    a comparator configured to receive the first detection signal through a positive input, receive the second detection signal through a negative input, and output a comparison signal indicating a comparison result between the first and second detection signals;
    a gate driver configured to output a control signal according to the comparison signal;
    a power transistor configured to receive the power, and control the output of the switch current according to the control signal; and an inductor connected in series to an output line of the power transistor so as to pass the switch current.

2. The apparatus of claim 1, wherein the level adjuster comprises:
   a signal power detector configured to smooth any one of the input signal and the output signal and output the smoothed signal as a detected voltage; and
   a switch current adjuster configured to convert the detected voltage into a current and output the current as the adjusting current.

3. The apparatus of claim 1, wherein the linear amplifier comprises:
   an operational amplifier configured to receive the input signal through a positive input and generate first and second operation signals reverse to each other;
   an operation output terminal configured to receive the first and second operation signals and output the linear current; and
   a feedback resistor having one side connected to the operation output terminal and the other side connected to a negative input of the operation amplifier.

4. The apparatus of claim 3, wherein the operation output terminal outputs the linear current,
   the linear current is one of a source current and a sink current,
   the source current is controlled by the first operation signal, and
   the sink current is controlled by the second operation signal.

5. The apparatus of claim 4, wherein when detecting that the linear current is the source current, the linear current detector outputs the first and second detection signals such that the first detection signal is smaller than the second detection signal, and
   when detecting that the linear current is the sink current, the linear current detector outputs the first and second detection signals such that the first detection signal is larger than the second detection signal.

6. The apparatus of claim 1, wherein the boost converter comprises a DC-DC converter configured to provide the clamped supply voltage.

7. The apparatus of claim 1, wherein the supply voltage and the voltage of the power are asymmetrical with each other.

8. The apparatus of claim 2, wherein the signal power detector comprises a low-pass filter.

9. The apparatus of claim 2, wherein the switch current adjuster comprises a voltage current converter.

10. The apparatus of claim 1, wherein the ratio of the linear current to the switch current is adjusted according to one or more of the signal bandwidth of the input signal and a peak-to-average power ratio (PAPR).

11. The apparatus of claim 1, wherein the input signal comprises an envelope signal.

12. The apparatus of claim 2, wherein the input signal comprises an envelope signal.

13. The apparatus of claim 3, wherein the input signal comprises an envelope signal.

14. The apparatus of claim 10, wherein the input signal comprises an envelope signal.

* * * * *